United States Patent
Arnold

(10) Patent No.: US 8,026,472 B2
(45) Date of Patent: Sep. 27, 2011

(54) TOUCH-SENSITIVE MOMENTARY CONTACT SWITCH WITH AN EVALUATION CIRCUIT DETECTING A MALFUNCTION IN AN OPTICAL SENSOR

(75) Inventor: Georg Arnold, Schwabach (DE)

(73) Assignee: Diehl Ako Stiftung & Co. KG, Wangen (DE)

(*) Notice: Subject to any disclaimer, the term of this patent is extended or adjusted under 35 U.S.C. 154(b) by 24 days.

(21) Appl. No.: 12/560,045

(22) Filed: Sep. 15, 2009

(65) Prior Publication Data

US 2010/0025572 A1     Feb. 4, 2010

Related U.S. Application Data

(63) Continuation of application No. 11/416,813, filed on May 3, 2006, now abandoned.

(30) Foreign Application Priority Data

Jun. 4, 2005   (DE) .................. 10 2005 025 782

(51) Int. Cl.
  *G06M 7/00*   (2006.01)

(52) U.S. Cl. .............. 250/221; 250/222.1; 345/170; 345/175

(58) Field of Classification Search .............. 250/222.1, 250/221; 345/170, 173, 175
See application file for complete search history.

(56) References Cited

U.S. PATENT DOCUMENTS

| 6,664,798 B2 | 12/2003 | De Jong et al. |
| 6,835,923 B2 | 12/2004 | Hämäläinen et al. |

FOREIGN PATENT DOCUMENTS

| DE | 40 07 971 A1 | 9/1991 |
| DE | 197 00 836 C1 | 5/1998 |
| EP | 1 313 222 A1 | 5/2003 |
| EP | 1 431 780 A2 | 6/2004 |
| WO | 01/63310 A1 | 8/2001 |

*Primary Examiner* — Francis M Legasse, Jr.
(74) *Attorney, Agent, or Firm* — Laurence A. Greenberg; Werner H. Sterner; Ralph E. Locher

(57) ABSTRACT

A touch-sensitive momentary-contact switch has an optical sensor, particularly an infrared sensor, and an evaluation circuit. The evaluation circuit is able to identify a malfunction in the optical sensor, so that the momentary-contact switch can be switched off, for example, for safety reasons. Therefore, it is possible to identify a malfunction in the optical sensor.

5 Claims, 4 Drawing Sheets

Evaluation Circuit

TOUCH-SENSITIVE MOMENTARY CONTACT SWITCH WITH AN EVALUATION CIRCUIT DETECTING A MALFUNCTION IN AN OPTICAL SENSOR

CROSS-REFERENCE TO RELATED APPLICATION

This is a continuation application of application Ser. No. 11/416,813, filed May 3, 2006; the application also claims the priority, under 35 U.S.C. §119, of German patent application No. DE 10 2005 025 782.8, filed Jun. 4, 2005; the prior applications are herewith incorporated by reference in their entirety.

BACKGROUND OF THE INVENTION

Field of the Invention

The present invention relates to a touch-sensitive momentary-contact switch and particularly to such a momentary-contact switch for use in a control device for a household appliance.

The basic design and the basic principle of such a touch-sensitive momentary-contact switch are known from published, non-prosecuted German patent application DE 40 07 971 A1, for example. The touch-sensitive momentary-contact switch has a transmitter emitting electromagnetic radiation and a receiver receiving electromagnetic radiation, which are disposed downstream of a cover which is at least partially permeable to the electromagnetic radiation. In addition, an evaluation circuit for evaluating a measurement signal produced by the receiver and producing an evaluation signal for further processing is generally provided. One advantageous application of such touch-sensitive momentary-contact switches is their use in control devices for household appliances, for example, such as cookers, glass ceramic hobs, microwave ovens and the like, in which the momentary-contact switch is accommodated behind a cover, such as a glass plate or glass ceramic plate, for simple operation and cleaning.

One problem of conventional momentary-contact switches of this type is that it is not possible to identify whether the optical sensor, i.e. particularly the transmitter and/or the receiver, in the momentary-contact switch is faulty. This is also a safety risk, for example if the momentary-contact switch becomes faulty only after being successfully switched on and therefore cannot be switched off again. There is therefore a need for a touch-sensitive momentary-contact switch of the type mentioned in the introduction in which it is possible to identify a malfunction in the optical sensor, so that an appropriate reaction to an identified malfunction of this type is finally possible if appropriate.

SUMMARY OF THE INVENTION

It is accordingly an object of the invention to provide a touch-sensitive momentary-contact switch which overcomes the above-mentioned disadvantages of the prior art devices of this general type, in which it is possible to identify a malfunction in its optical sensor.

With the foregoing and other objects in view there is provided, in accordance with the invention, a touch-sensitive momentary-contact switch. The momentary-contact switch contains a cover being at least partially permeable to electromagnetic radiation, an optical sensor having a transmitter emitting the electromagnetic radiation and a receiver for receiving the electromagnetic radiation and disposed downstream of the cover, and an evaluation circuit for evaluating a measurement signal generated by the receiver and producing an evaluation signal. A device is provided for routing a portion of the electromagnetic radiation emitted by the transmitter to the receiver even when the momentary-contact switch is not operated. The evaluation circuit takes a detected basic level of the evaluation signal as a basis for assessing that there is a malfunction in the optical sensor if no change in a level of the evaluation signal in the evaluation circuit is detected during a transmission cycle by the transmitter.

The inventive momentary-contact switch is distinguished in that a device is provided for routing a portion of the electromagnetic radiation emitted by the transmitter to the receiver even when the momentary-contact switch is not operated. The evaluation circuit takes a detected basic level of the evaluation signal as a basis for assessing that there is a malfunction in the optical sensor if no change in the evaluation signal level in the evaluation circuit is detected during a transmission cycle initiated by the transmitter.

The effect achieved by the above configuration of the momentary-contact switch is that the receiver receives a small amount of radiation and thus produces an appropriate measurement signal even when the momentary-contact switch is not operated. If the measurement signal is not produced, the evaluation circuit can infer that the optical sensor has malfunctioned. In this case, it is also necessary to take account of the basic level of the evaluation signal, however, since in the case of a flare, for example, it is not possible to detect a change in the evaluation signal level (when the momentary-contact switch is or is not operated) even when the optical sensor is working.

In one refinement of the invention, the device has an at least partially permeable feed-through opening in a partition in a masking frame between the transmitter and the receiver, so that regardless of the momentary-contact switch being operated a portion of the radiation emitted by the transmitter always arrives at the receiver directly through the feed-through opening.

In one alternative refinement of the invention, the device has the cover, which is configured such that a portion of the radiation emitted by the transmitter is reflected on the front and/or the back surface of the cover in the direction of the receiver. This can be achieved, by way of example, by choosing a specific refractive index for the material of the cover, by a specific nature of the surfaces or by a specific coating for the surfaces of the cover.

The inventive momentary-contact switch is distinguished in that the evaluation circuit additionally has a device for changing over a measurement range for the evaluation signal. The evaluation circuit takes a detected basic level of the evaluation signal as a basis for assessing that there is a malfunction in the optical sensor if the basic level of the evaluation signal detects no change in the evaluation signal level in the evaluation circuit during a changeover cycle in the measurement range.

The above configuration of the evaluation circuit makes it possible to change over a measurement range for the purpose of measuring the saturation voltage of the receiver, which causes a voltage step change in the evaluation signal. If this voltage step change is not produced, the evaluation circuit can infer that the optical sensor has malfunctioned. Such a voltage step change cannot be produced, in principle, if the receiver is incorrectly at the level of the supply voltage or if the receiver is shorted, for example.

In one refinement of the invention, the evaluation circuit has a voltage divider circuit which is formed from a first resistor and a first transistor, with the first transistor being controlled by the measurement signal from the receiver, and the evaluation signal in the evaluation circuit being tapped off between the first resistor and the first transistor. In this case, the device is a device for altering the voltage divider ratio.

In a further refinement of the invention, the device has a series circuit containing a second transistor and a second resistor which is connected in parallel with the first resistor, the second transistor being turned on during the changeover cycle. In addition, a third resistor is connected in parallel with the first transistor in the evaluation circuit.

In line with a third aspect of the invention, the aforementioned object can naturally also be achieved by a combination of the first and second aspects. In this case, the momentary-contact switch contains a device for routing a portion of the electromagnetic radiation emitted by the transmitter to the receiver even when the momentary-contact switch is not operated, and the evaluation circuit additionally has a device for changing over a measurement range for the evaluation signal, so that the evaluation circuit can take a detected basic level of the evaluation signal as a basis for assessing that there is a malfunction in the optical sensor if no change in the evaluation signal level in the evaluation circuit is detected during a transmission cycle in the transmitter and/or during a changeover cycle in the measurement range of the evaluation signal.

Other features which are considered as characteristic for the invention are set forth in the appended claims.

Although the invention is illustrated and described herein as embodied in a touch-sensitive momentary-contact switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
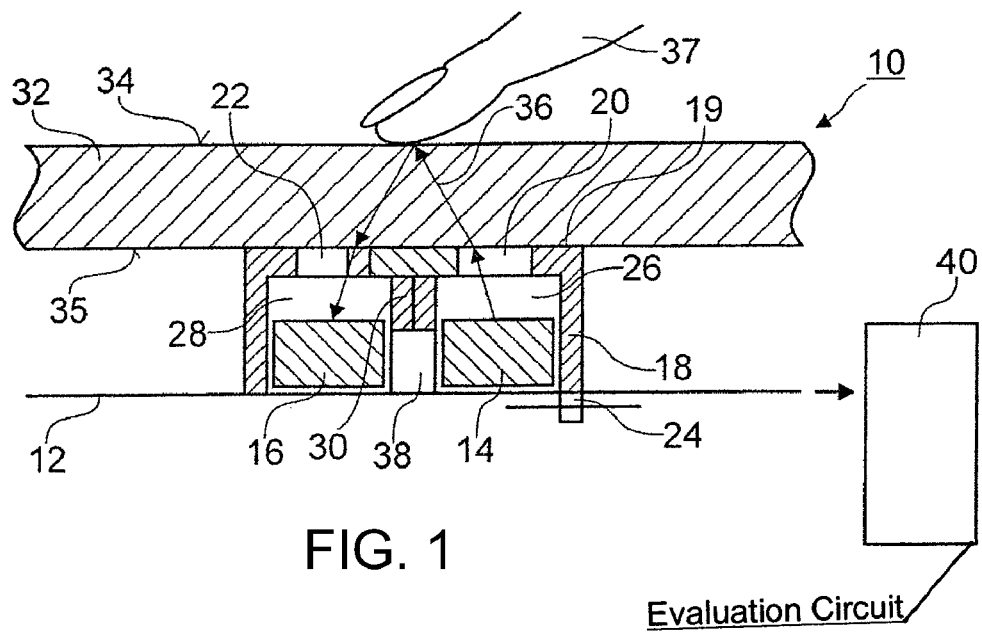
FIG. 1 is a diagrammatic, sectional view of a touch-sensitive momentary-contact switch in line with a preferred exemplary embodiment according to the invention.

Referring now to the figures of the drawing in detail and first, particularly, to FIG. 1 thereof, there is shown a mechanical configuration of a touch-sensitive momentary-contact switch 10 according to the invention. The touch-sensitive momentary-contact switch from the invention is an infrared momentary-contact switch for a household appliance, for example, such as a cooker, a microwave oven, a hob, a washing machine, a washer-dryer, a dishwasher or the like, without the invention being limited to electromagnetic radiation in this wavelength range or to these specific applications.

The touch-sensitive momentary-contact switch 10 has an infrared transmitter 14 and an infrared receiver 16 on a printed circuit board 12. The transmitter 14 and the receiver 16 are surrounded by a masking frame 18 which has two openings 20 and 22 on its top 19. The masking frame 18, formed from an infrared-impermeable material, has feet 24 inserted through holes in the printed circuit board 12 and is mounted on the latter in this way.

The transmitter 14 and the receiver 16 are positioned in the masking frame 18 such that they are disposed within respective cavities 26 and 28 below the masking openings 20 and 22. In this case, the two cavities 26 and 28 are separated from one another by an infrared-impermeable partition 30. Lying directly on the top 19 of the masking frame 18 is a cover 32 made of a material which is at least partially permeable to infrared, for example a glass ceramic plate on a household cooker.

The radiation emitted by the transmitter 14 arrives at the top 34 of the cover 32 via an optical path 36. When the touch-sensitive momentary-contact switch 10 is operated by a finger 37 placed onto the surface of the cover 32, the radiation from the transmitter 14 is reflected diffusely and a plurality of times, so that sufficient scattered radiation is reflected to the receiver 16 and the latter sends an appropriate measurement signal $V_E$ to an evaluation circuit 40 in order to trigger an appropriate switching function.

Figure 2:
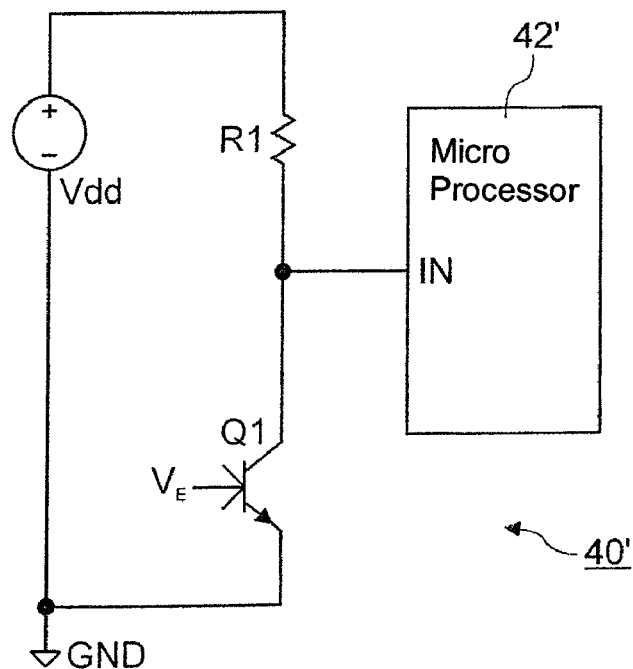
FIG. 2 is a simplified circuit diagram of a conventional evaluation circuit.

In the case of a conventional evaluation circuit 40', as illustrated in FIG. 2, the measurement signal $V_E$ would switch a first transistor Q1 in a voltage divider circuit which is constructed from a first resistor R1 and the first transistor Q1 and to which a supply voltage $V_{dd}$ is applied. In this case, the transistor Q1 acts as a receiver. An evaluation signal $V_{IN}$ is tapped off between the first resistor R1 and the first transistor Q1 and is supplied to a microprocessor 4' for further processing. In the case of an operable momentary-contact switch 10, the first transistor Q1 has a high impedance when the momentary-contact switch 10 is not operated, which results in that the evaluation signal $V_{IN}$ has a high signal level. When the momentary-contact switch 10 is operated, the first transistor 10 is switched to low impedance by the measurement signal $V_E$ from the receiver 16, so that the signal level of the evaluation signal $V_{IN}$ drops accordingly, which the microprocessor 42' interprets as the momentary-contact switch 10 being operated.

If there is a fault in the optical sensor 14, 16 or in the resistor R1 or in other components of the momentary-contact switch 10, the microprocessor 42' is no longer able to identify when the momentary-contact switch 10 is operated. In addition, the conventional evaluation circuit 40' does not allow such a fault in the optical sensor 14, 16 to be identified and reacted to in appropriate fashion, which in some cases can be a safety risk, for example when a hotplate can no longer be switched off.

To increase the operational reliability of the touch-sensitive momentary-contact switch 10, the following measures are therefore taken in line with the present invention.

As FIG. 1 shows, the partition 30 in the masking frame 18 has a feed-through opening 38 which is at least partially permeable to the electromagnetic radiation emitted by the transmitter 14. In addition or alternatively, a top 34 and/or a underside 35 of the cover 32 may be of a nature or coated such that at least one portion of the electromagnetic radiation from the transmitter 14 is reflected in the direction of the receiver 16. In this way, the first measure achieved is that the receiver 16 receives a certain amount of radiation from the transmitter 14 and produces an appropriate measurement signal $V_E$ for the evaluation circuit 40 even when the momentary-contact switch 10 is not operated.

Figure 3:
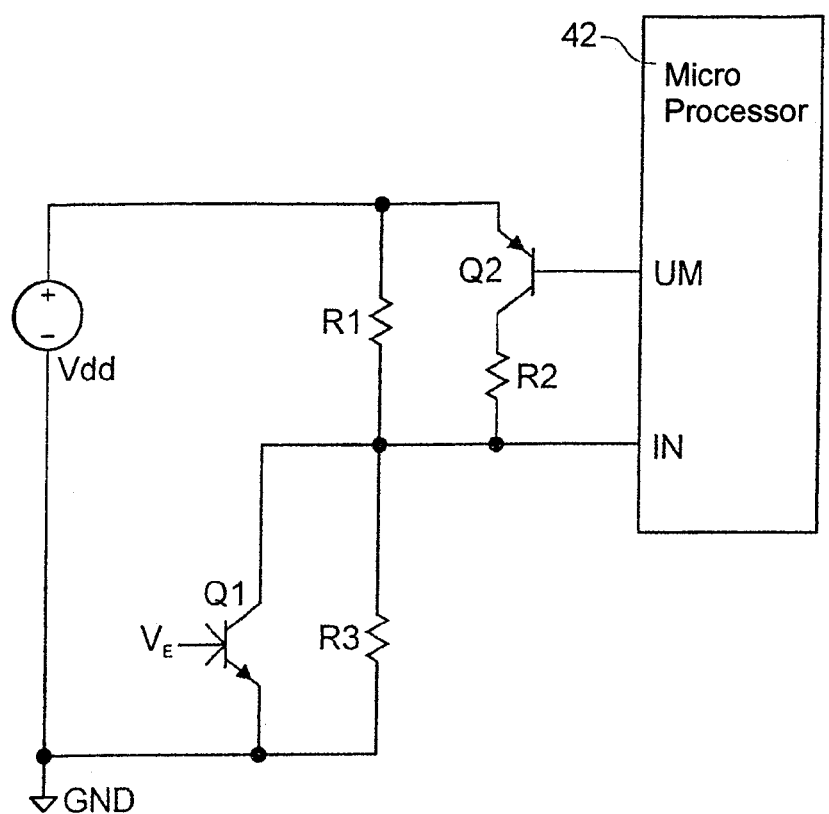
FIG. 3 is a simplified circuit diagram of an evaluation circuit for the touch-sensitive momentary-contact switch based on a preferred exemplary embodiment of the present invention.

As a second measure, a measurement range changeover is introduced, which modifies the evaluation circuit 40 for the touch-sensitive momentary-contact switch 10, as shown in FIG. 3.

In this case too, the basic design of the inventive evaluation circuit 40 is a voltage divider circuit which contains a first resistor R1 and a first transistor Q1 between which the evaluation signal $V_{IN}$ is tapped off and is input at an input IN of the microprocessor 42 for further handling and evaluation. In addition, a series circuit containing a second transistor Q2 and a second resistor R2 is connected in parallel with the first resistor R1, the second resistor R2 being chosen to have a very low value (for example a few kΩ) and the second transistor Q2 being controlled by a changeover signal from a control output UM of the microprocessor 42. Preferably, a third (preferably high-value) resistor R3 is also connected in parallel with the first transistor Q1.

The way in which this modified voltage divider circuit in the evaluation circuit 40 works is as follows. In the normal state, when the second transistor Q2 is not receiving a changeover signal from the microprocessor 42 and is therefore off, the evaluation signal $V_{IN}$ is set up essentially by the voltage divider made up of R1 and Q1. In other words, the evaluation signal $V_{IN}$ in this circuit state corresponds to the "normal" evaluation signal. When the microprocessor 42 outputs the changeover signal, on the other hand, the second transistor Q2 is turned on, so that the voltage divider is determined essentially by the low-impedance series circuit containing Q2 and R2 and by the first transistor Q1. In comparison with the "normal" evaluation signal, the level of the evaluation signal $V_{IN}$ is now shifted in the direction of the supply voltage $V_{dd}$, however. The third resistor R3, connected in parallel with the first transistor Q1, ensures that the shift in the evaluation signal level $V_{IN}$ can be produced by the changeover signal even when it is dark on the momentary-contact switch 10.

The two measures described above, i.e. a measurement signal $V_E$ even when the momentary-contact switch 10 is not operated and a shift in the voltage divider ratio, are utilized by the evaluation circuit 40 in the following manner to identify a fault in the optical sensor 14, 16.

The signal profile of an evaluation signal $V_{IN}$ in the inventive momentary-contact switch 10 is first described below with reference to FIGS. 4 and 5 for the case of an operable optical sensor 14,16.

Figure 4:
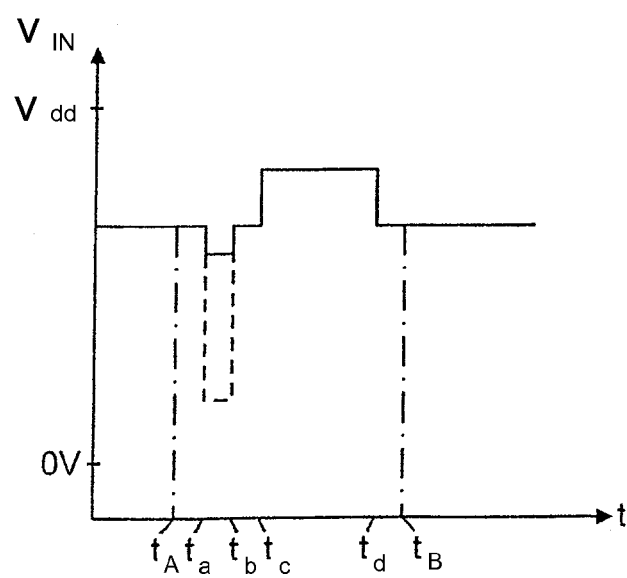
FIGS. 4 and 5 are schematic signal graphs to explain a signal profile of an evaluation signal in the evaluation circuit from FIG. 3 based on the present invention when the optical sensor in the touch-sensitive momentary-contact switch is operable.

As FIG. 4 shows, the momentary-contact switch 10 is evaluated in multiplex mode in the time window $t_A$ to $t_B$. Within this time window $t_A$-$t_B$, there exist in succession a transmission cycle $t_a$ to $t_b$, in which the transmitter 14 emits radiation, and a changeover cycle $t_C$ to $t_D$, in which the microprocessor 42 outputs the changeover signal to the second transistor Q2. Outside the time window $t_A$-$t_B$, the multiplexer mode is switched to other momentary-contact switches in the control device.

In another embodiment, by not using multiplex mode, this circuit also allows only a single key to be used and evaluated.

FIG. 4 shows the signal profile for an evaluation signal $V_{IN}$ when the momentary-contact switch 10 is not operated and when the momentary-contact switch 10 has no flare. In response to the radiation emitted by the transmitter 14, the receiver 16 produces a measurement signal $V_E$, which results in a slight lowering of the evaluation signal level $V_{IN}$ (swing) during the transmission cycle $t_a$-$t_b$. This lowering of the evaluation signal $B_{IN}$ would be significantly more pronounced if the momentary-contact switch were operated, as indicated by a dashed signal profile in FIG. 4. Following this, the evaluation signal level $V_{IN}$ is shifted in the direction of the supply voltage Vdd during the changeover cycle $t_c$-$t_d$ (step). The basic level of the evaluation signal $V_{IN}$ is between 0V and Vdd closer to Vdd in this case.

Figure 5:
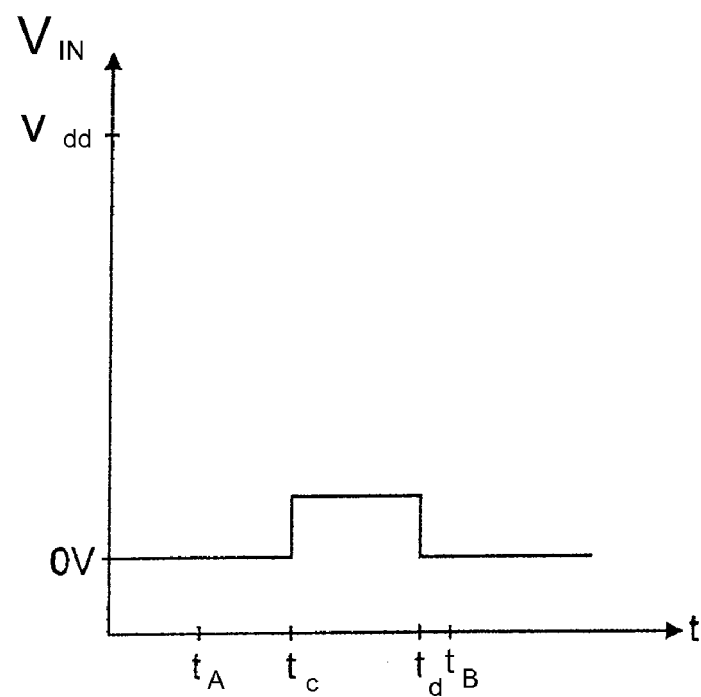

If the momentary-contact switch 10, i.e. its optical sensor, has a high level of flare on account of the incidence of light from an external source, so that the basic level of the evaluation signal $V_{IN}$ falls to 0V, as illustrated in FIG. 5, then the swing described above during the transmission cycle $t_a$-$t_b$ cannot be detected by the evaluation circuit. On the other hand, the evaluation circuit 40 can still detect the step during the changeover cycle $t_c$-$t_d$ even in this case. Despite the missing swing in the transmission cycle $t_a$-$t_b$, the evaluation circuit 40 can therefore tell from the step in the changeover cycle $t_c$-$t_d$ that the optical sensor 14, 16 is operable.

Just from the two signal profiles in FIG. 4 and FIG. 5, it is therefore possible to see that the evaluation circuit 40 needs to take the basic level of the evaluation signal $V_{IN}$ into account in order to assess that the optical sensor 14, 16 is faulty. Depending on the basic level of the evaluation signal $V_{IN}$, various indicators are crucial for assessing that there is a fault in the optical sensor 14, 16.

Figure 6:
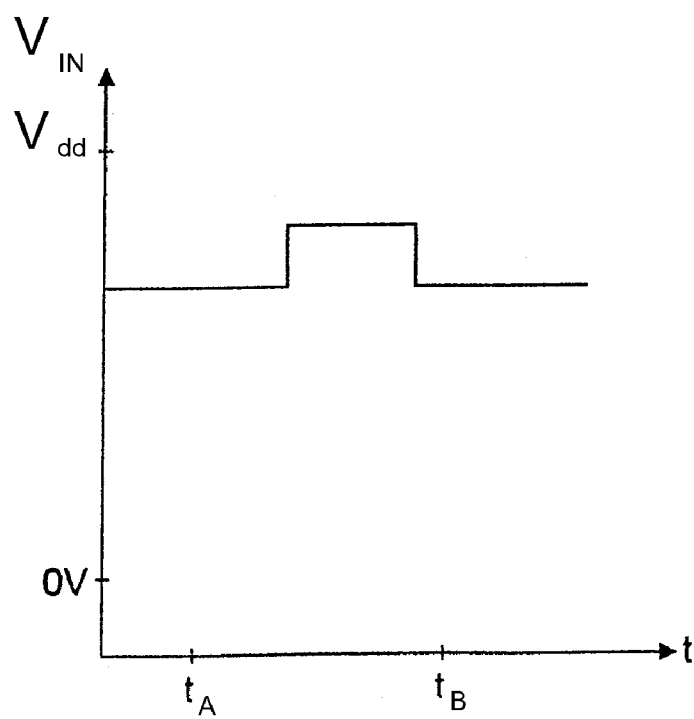
FIGS. 6 to 8 are schematic signal graphs to explain the signal profile of the evaluation signal in the evaluation circuit from FIG. 3 based on the present invention when the optical sensor in the touch-sensitive momentary-contact switch is faulty.
Figure 7:
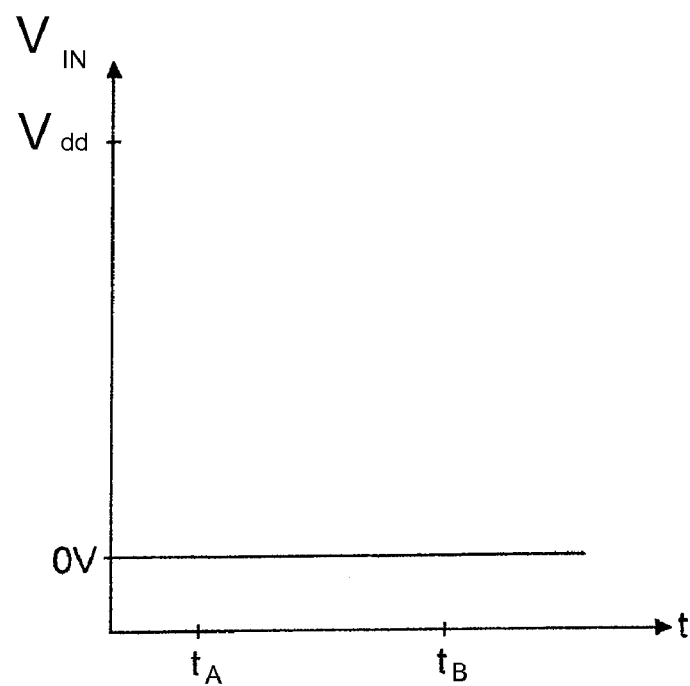
Figure 8:
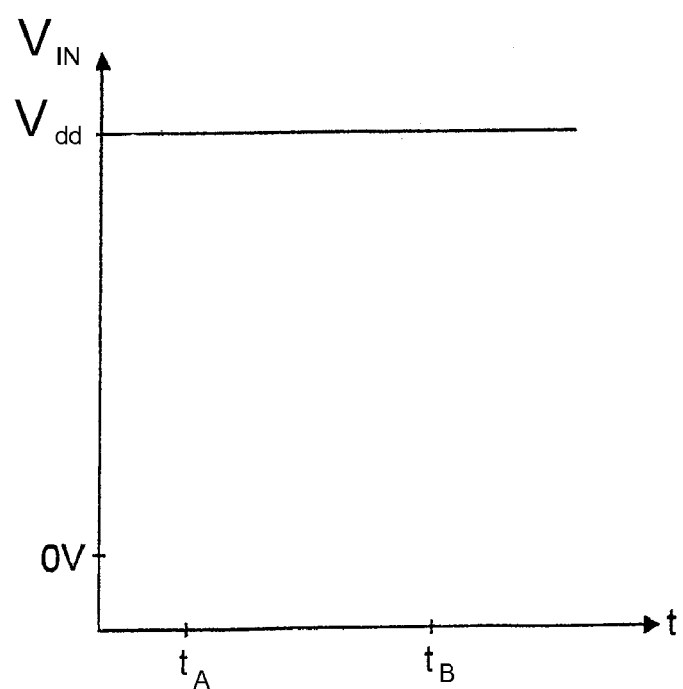

FIGS. 6 to 8 are now used to describe various signal profiles for the evaluation signal $V_{IN}$ in each case for a faulty optical sensor 14, 16 and a faulty momentary-contact switch 10.

In the example in FIG. 6, the basic level of the evaluation signal $V_{IN}$ is at the level of the normal evaluation signal between 0V and Vdd. In the time window $t_A$-$t_B$ for this momentary-contact switch 10, however, only the step in the changeover cycle $t_c$-$t_d$ can be seen; there is no swing during the transmission cycle $t_a$-$t_b$. The microprocessor 42 can use this evaluation signal $V_{IN}$ to assess that the momentary-contact switch 10 is faulty, to be more precise that the transmitter 14 is faulty or that a connection on the receiver 16 is open, for example.

In FIG. 7, the basic level of the evaluation signal $V_{IN}$ has been lowered to 0 V and neither the swing in the transmission cycle $t_a$-$t_b$ nor the step in the changeover cycle $t_c$-$t_d$ are present. In this case, the microprocessor 42 likewise infers that the momentary-contact switch 10 is faulty, to be more precise that the receiver 16 is shorted, for example. This fault could still be detected even if the momentary-contact switch 10 had a flare, since, as FIG. 5 shows, an operable momentary-contact switch 10 would necessarily have at least the step during the changeover cycle $t_c$-$t_d$.

FIG. 8 shows a further fault case for the momentary-contact switch 10, in which the receiver 16 (or another component) is at the level of the supply voltage Vdd. In this case, the basic level of the evaluation signal $V_{IN}$ is pulled up to the supply voltage Vdd, and there is neither a swing during the transmission cycle $t_a$-$t_b$ nor a step during the changeover cycle $t_c$-$t_d$.

A person skilled in the art will have no difficulty in recognizing the signal profile of the evaluation signal $V_{IN}$, which signal profile is produced for other special fault cases for the momentary-contact switch 10 which can likewise occur, without all possibilities needing to be discussed within this application.

A crucial element for assessing that the momentary-contact switch 10 is faulty is that, in addition to the presence or absence of the swing during the transmission cycle $t_a$-$t_b$ and of the step during the changeover cycle $t_c$-$t_d$, the respective basic level of the evaluation signal $V_{IN}$ is also taken into account at the same time.

In addition, it is naturally also possible to provide a touch-sensitive momentary-contact switch 10 which has just one error detection measure. Although this inevitably results in that not all possible types of faults in the momentary-contact switch 10 can be identified without any doubt, this would nevertheless signify an improvement in the conventional momentary-contact switches without any error detection.

If the above evaluation circuit 40 assesses that the momentary-contact switch 10 is faulty, appropriate measures can be taken, such as automatically switching off the appliance, in order to increase safety.

To increase operational reliability further, it is also advantageous if, once a fault in the momentary-contact switch 10 has been identified, it is stored in the form of an appropriate marker, for example, so that this fault is identified at a later time, even if it were not able to be detected on account of the optical sensor currently having a flare, for example. When the momentary-contact switch 10 is repaired, these markers would naturally be able to be reset.

In principle, the circuits in FIGS. 2 and 3 can also be produced with reversed polarity, which likewise results in reversed polarity for the illustration in FIGS. 4 to 8.

The invention claimed is:

1. A touch-sensitive momentary-contact switch, comprising:
    a cover being at least partially permeable to electromagnetic radiation;
    an optical sensor having a transmitter emitting the electromagnetic radiation and a receiver for receiving the electromagnetic radiation and disposed downstream of said cover; and
    an evaluation circuit for evaluating a measurement signal produced by said receiver and generating an evaluation signal, said evaluation circuit having a device for changing over a measurement range for the evaluation signal, said evaluation circuit taking a detected basic level of the evaluation signal as a basis for assessing that there is a malfunction in said optical sensor if no change in a level of the evaluation signal in said evaluation circuit is detected during a changeover cycle for changing the level of the evaluation signal;
    said evaluation circuit having a voltage divider circuit formed of a first resistor and a first transistor, said first transistor being controlled by the measurement signal from said receiver, the evaluation signal in said evaluation circuit being tapped off between said first resistor and said first transistor; and
    said device being a device for altering a voltage divider ratio of said voltage divider circuit.

2. The touch-sensitive momentary-contact switch according to claim 1, wherein:
    said device has a series circuit containing a second transistor and a second resistor, said series circuit connected in parallel with said first resistor, said second transistor being turned on during the changeover cycle.

3. The touch-sensitive momentary-contact switch according to claim 1, further comprising a device through which diffuse electromagnetic radiation emitted by said transmitter passes to said receiver, even when the momentary-contact switch is not operated, said device including a masking frame and a partition with an at least partially permeable feed-through opening formed therein, said partition disposed in said masking frame between said transmitter and said receiver.

4. The touch-sensitive momentary-contact switch according to claim 1, wherein said cover has a front surface and a back surface and reflects a portion of the electromagnetic radiation emitted by said transmitter by said front surface and/or said back surface in a direction of said receiver.

5. The touch-sensitive momentary-contact switch according to claim 2, further comprising a third resistor connected in parallel with said first transistor.

* * * * *